US007761830B1

(12) United States Patent
Kaszynski

(10) Patent No.: US 7,761,830 B1
(45) Date of Patent: Jul. 20, 2010

(54) METHOD AND SYSTEM FOR PROVIDING PLACEMENT BASED CONFIGURATIONS IN INTEGRATED CIRCUITS

(75) Inventor: Robert J. Kaszynski, Mendota Heights, MN (US)

(73) Assignee: XILINX, Inc., San Jose, CA (US)

(*) Notice: Subject to any disclaimer, the term of this patent is extended or adjusted under 35 U.S.C. 154(b) by 308 days.

(21) Appl. No.: 11/786,192

(22) Filed: Apr. 10, 2007

Related U.S. Application Data

(62) Division of application No. 11/036,310, filed on Jan. 14, 2005, now Pat. No. 7,222,324.

(51) Int. Cl.
*G06F 17/50* (2006.01)

(52) U.S. Cl. .................. 716/9; 716/10; 716/11; 716/16

(58) Field of Classification Search .......... 716/1–2, 716/5–11, 16–18
See application file for complete search history.

(56) References Cited

U.S. PATENT DOCUMENTS

| | | | |
|---|---|---|---|
| 6,487,708 B1 | 11/2002 | Canaris | |
| 6,516,454 B1 * | 2/2003 | Hirata et al. | 716/6 |
| 6,763,503 B1 * | 7/2004 | Yang et al. | 716/4 |
| 6,925,621 B2 | 8/2005 | Mielke et al. | |
| 6,931,610 B1 * | 8/2005 | Buch et al. | 716/5 |
| 7,222,324 B1 | 5/2007 | Kaszynski | |
| 7,228,520 B1 * | 6/2007 | Keller et al. | 716/17 |
| 7,268,580 B2 | 9/2007 | Madurawe | |
| 7,392,498 B1 * | 6/2008 | Srinivasan et al. | 716/16 |
| 7,516,423 B2 * | 4/2009 | De Smedt et al. | 716/1 |
| 2004/0117755 A1 * | 6/2004 | Blodget et al. | 716/17 |
| 2005/0102646 A1 | 5/2005 | Madurawe | |
| 2005/0108668 A1 * | 5/2005 | Kabuo | 716/8 |
| 2007/0234266 A1 * | 10/2007 | Chen et al. | 716/13 |

* cited by examiner

*Primary Examiner*—Paul Dinh
(74) *Attorney, Agent, or Firm*—LeRoy D. Maunu

(57) ABSTRACT

A method for providing placement based configurations in integrated circuits and integrated circuits having configurable data files for logic blocks based on the location of the blocks therein are disclosed. Location information for at least one logic block in an integrated circuit is identified. A configuration data file for configuring the at least one logic block in the integrated circuit is generated based on the identified location of the at least one logic block.

16 Claims, 6 Drawing Sheets

METHOD AND SYSTEM FOR PROVIDING PLACEMENT BASED CONFIGURATIONS IN INTEGRATED CIRCUITS

FIELD OF THE INVENTION

This disclosure relates in general to providing placement based configurations in programmable logic devices.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, and then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

In a PLD, CLBs, IOBs, interconnect, and other logic blocks are typically programmed by loading a stream of configuration data (bitstream) into internal configuration memory cells that define how the CLBs, IOBs, and interconnect are configured. The configuration data may be read from memory (e.g., an external PROM) or written into the FPGA by an external device. The collective states of the individual memory cells then determine the function of the FPGA.

Current technology allows for configuration of an FPGA device based on function only. Thus, current techniques of FGPA implementation do not take into consideration the actual location or function of a circuit on the silicon die, which can result in decreased circuit performance. For example, a master unit may be separated from a first by a first distance and from a second slave unit by a second distance. In this case, the locations of the first and second unit cause different propagation delays between the master unit and the two slave units. If propagation delays are not accounted for output glitches may occur for logic gates and/or data may be corrupted.

It can be seen then that there is a need for a method for providing placement based configurations in programmable logic devices and programmable logic devices having configurable data files for logic blocks based on the location of the blocks therein.

SUMMARY

To overcome the limitations described above, and to overcome other limitations that will become apparent upon reading and understanding the present specification, the present invention discloses a method for providing placement based configurations in programmable logic devices and programmable logic devices having configurable data files for logic blocks based on the location of the blocks therein.

Embodiments of the present invention solve the above-described problems by generating a configuration data file for configuring logic blocks within programmable logic devices based on location information associated with a block.

An embodiment of the present invention includes identifying location information for at least one logic block in a programmable logic device and generating a configuration data file for configuring the at least one logic block in the programmable logic device based on the identified location of the at least one logic block.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method for providing placement based configurations in programmable logic devices and programmable logic devices having configurable data files for logic blocks based on the location of the blocks therein. Location information for at least one logic block in a programmable logic device is identified. A configuration data file for configuring the at least one logic block in the programmable logic device is generated based on the identified location of the at least one logic block.

Figure 1:
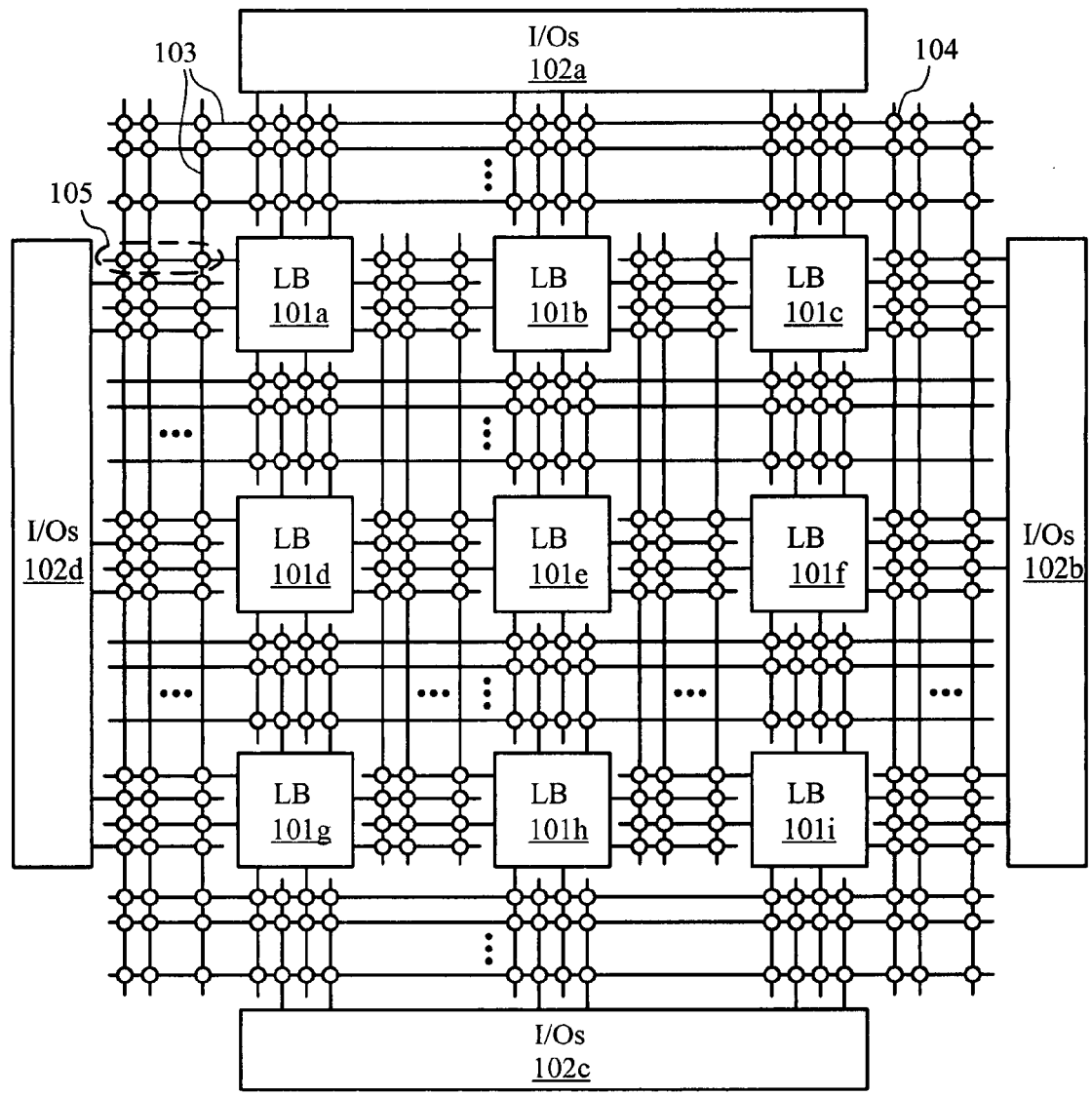
FIG. 1 is a simplified illustration of an exemplary FPGA.

FIG. 1 is a simplified illustration of an exemplary FPGA. The FPGA of FIG. 1 includes an array of configurable logic blocks (LBs 101a-101i) and programmable input/output blocks (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

Figure 2:
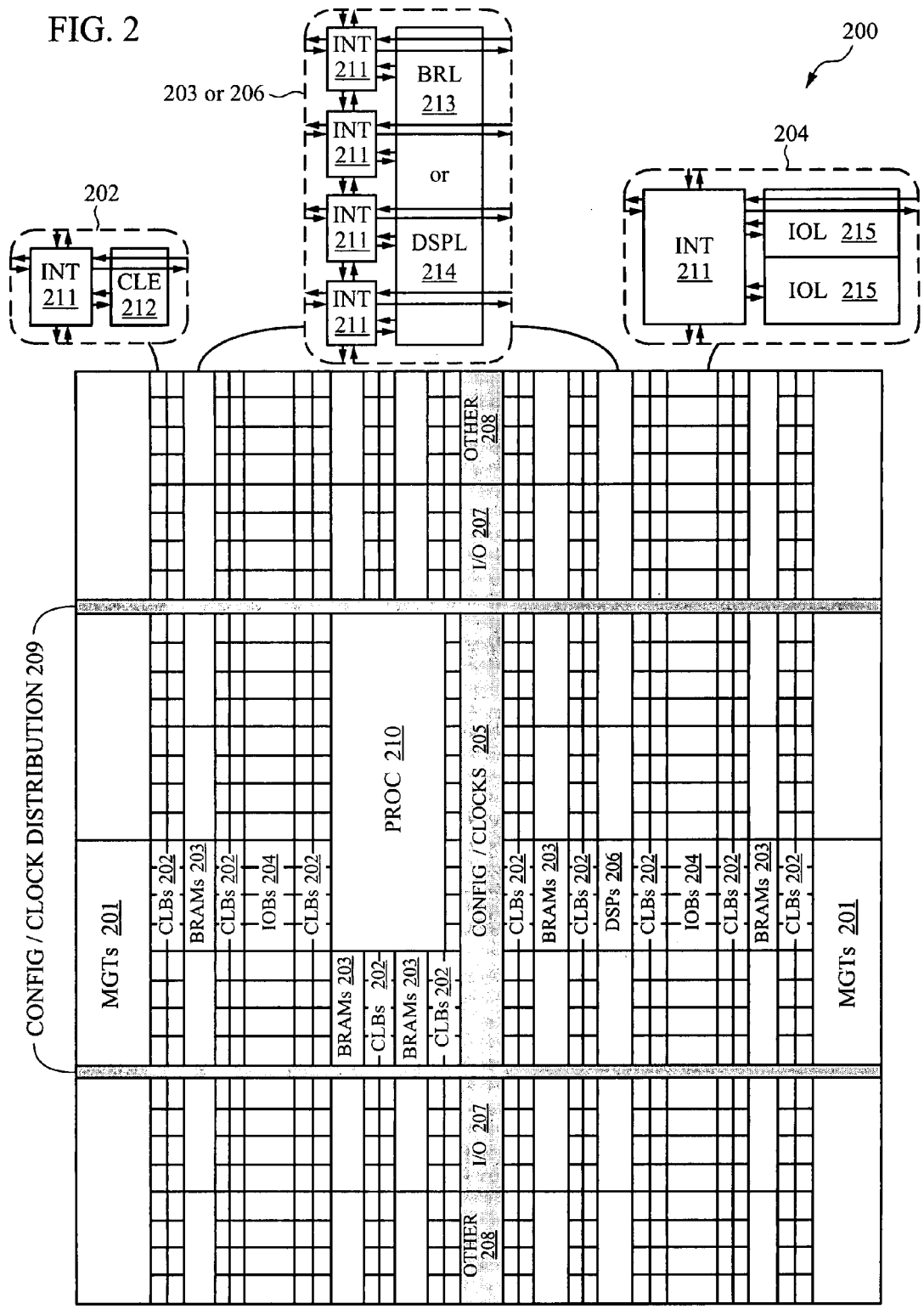
FIG. 2 illustrates an FPGA architecture according to an embodiment of the present invention.

FIG. 2 illustrates an FPGA architecture 200 according to an embodiment of the present invention. As noted above, advanced FPGAs can include several different types of programmable logic blocks in the array. For example, in FIG. 2, the FPGA architecture 200 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In one embodiment of the present invention the MGTs 201 include logic blocks which can be programmed. For example, an MGT can include, a channel bond logic block having a two bit attribute that is set during configuration of the MGT. The two bit attribute indicated whether the channel bond logic block is a master, slave one hop, or slave two hop. The slave one hop and slave two hop attributes give different delays to the master.

As an illustrative example, let a first channel bond logic block in a first MGT be a master, and a second channel bond logic block in a second MGT be a first slave, and a third channel bond logic block in a third MGT be a second slave. Let the second slave be placed at a location twice the distance to the master than the distance of the first slave to the master. The two bit attribute for the first channel bond logic block is set to indicate a master. The two bit attribute for the first slave can be set for a slave two hop and the two bit attribute for the second slave can be set as a slave one hop. Hence the first slave adds extra delay so that its data arrives at the master about the same time as the data from the second slave. In this embodiment the attributes (i.e., configuration memory cells) of the slaves are automatically set depending upon the slaves' locations.

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An 10B 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Configuration logic 205 allows configuration data values to be loaded into the FPGA architecture 200. In accordance with an embodiment of the present invention, the configuration data takes into consideration the actual location and/or function of a circuit on the silicon die, which can result in increased circuit performance and provide additional functional constructs. Placement based information is provided to the FPGA architecture 200 that will optimize it's design.

Note that FIG. 2 is intended to illustrate only one example of an FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
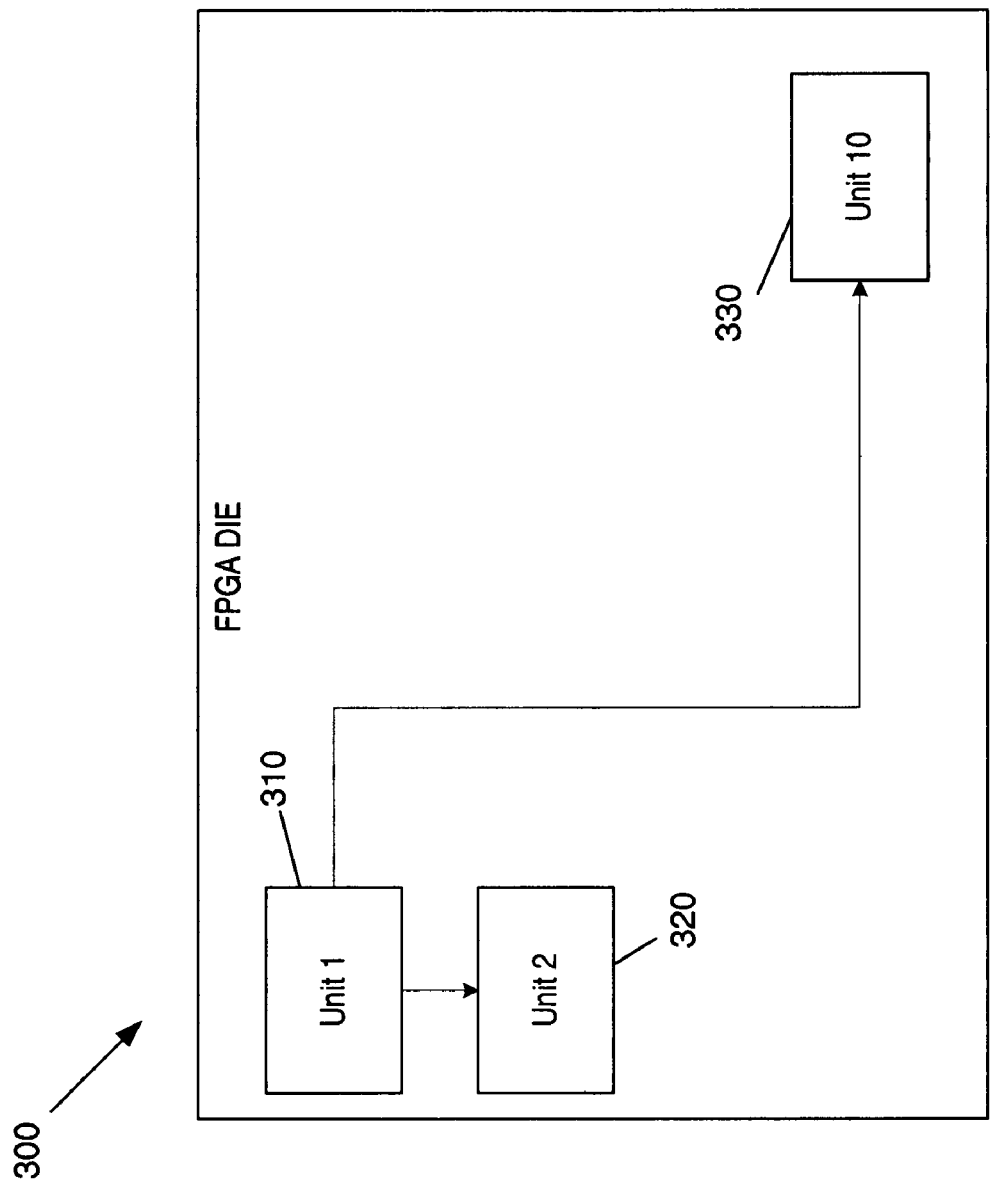
FIG. 3 illustrates a simplified block diagram of a programmable logic device demonstrating the use of location information to configure a programmable logic device according to an embodiment of the present invention.

FIG. 3 illustrates a simplified block diagram of a programmable logic device 300 demonstrating the use of location information to configure a programmable logic device according to an embodiment of the present invention. In FIG. 3, a master circuit 310 and slave circuits 320 and 330. Using current methods the functions or attributes of slave units 320 and 330 are generated without regard to their location. If the master circuit 310 sends a signal to the slaves 320, 330 it is assumed that the distance is the same when in reality slave circuit 320 will receive the signal first. If the location and/or function information is provided to the slave devices 320, 330 their performance can be adjusted and/or additional performance constructions may be provided.

Thus, according to an embodiment of the present invention, slave circuit 320 may be configured so that it will compensate for the extra delay that slave circuit 330 experiences. Other parameters that may be configured include setup times; hold times, clock width, clock period, propagation delay compensation recovery time, etc.

Figure 4:
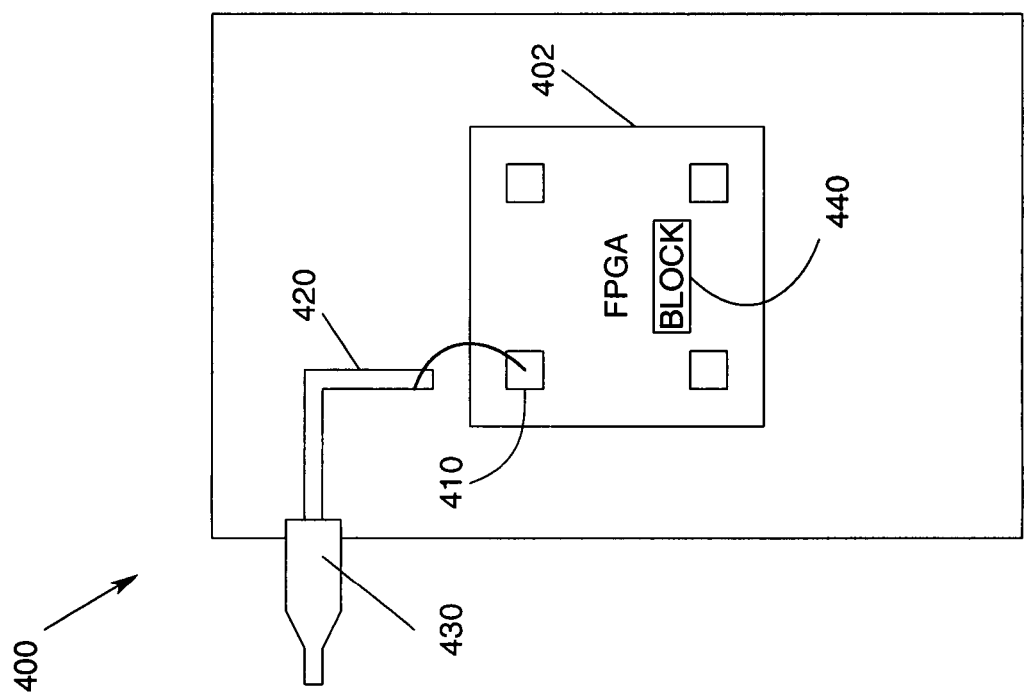
FIG. 4 illustrates a simplified block diagram of a FPGA demonstrating the use of the method for providing placement-based configurations according to another embodiment of the present invention.

FIG. 4 illustrates a simplified block diagram of a FPGA package 400 demonstrating the use of the method for providing placement-based configurations according to another embodiment of the present invention. Before describing FIG. 4, those of skilled in the art will recognize that the present invention is not meant to be limited to FPGAs or PLDs. Rather, the present invention is application to a broader category of devices including integrated circuits having programmable functions in general. In FIG. 4, a chip such as a FPGA 402 includes pads 410 for connecting to bonding wires 420. The bonding wire 420 may be gold or copper traces for example. The bonding wires 420 are coupled to pins 430 of the package 400. For clarity and simplicity only one pin 430 is shown. In referencing the FPGA package 400, a second example of a parameter for consideration when providing placement-based configurations may be contemplated, i.e., packaging effects. For example, blocks 440 of FPGA 402 may require different configuration settings based on parasitic effects of the packaging at that location. Location information may be provided and used to generate a configuration date file that accounts for the parasitic effect. The amount of parasitic effects to any driver is predictable and may be accounted for in the design of the drivers. Thus, the drivers may be optimized to drive the known loads they will have to drive.

Figure 5:
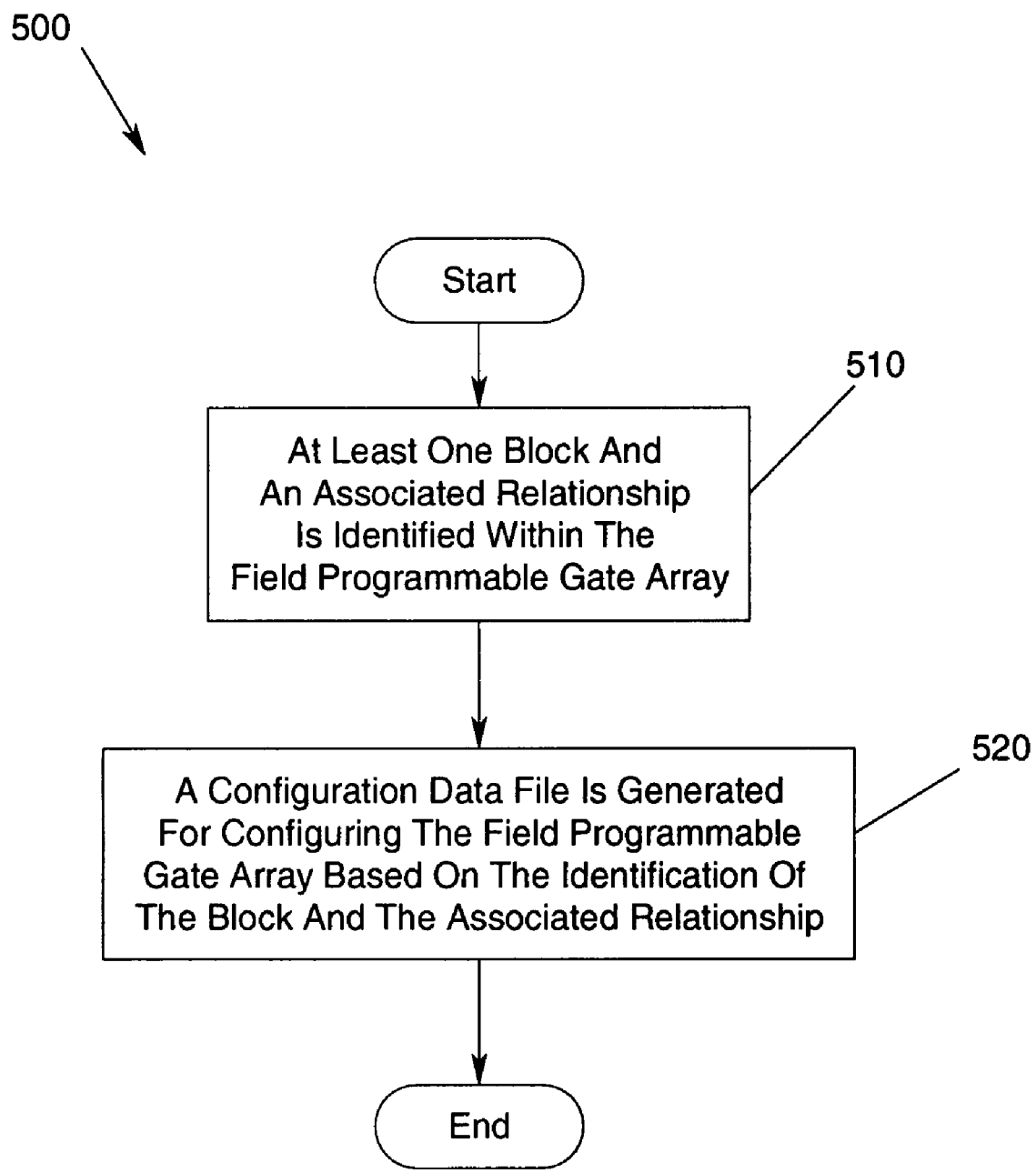
FIG. 5 is a flow chart of the method for providing placement based configurations in programmable logic devices according to an embodiment of the present invention.

FIG. 5 is a flow chart of the method for providing placement-based configurations in field programmable gate arrays according to an embodiment of the present invention. Location, information for at least one logic block in a FPGA is identified 510. A configuration data file for configuring the at least one logic block in the FPGA based on the identified location of the at least one logic block is generated 520. For example, the block may be identified as a master or a slave relative to another block within the field programmable gate array.

Figure 6:
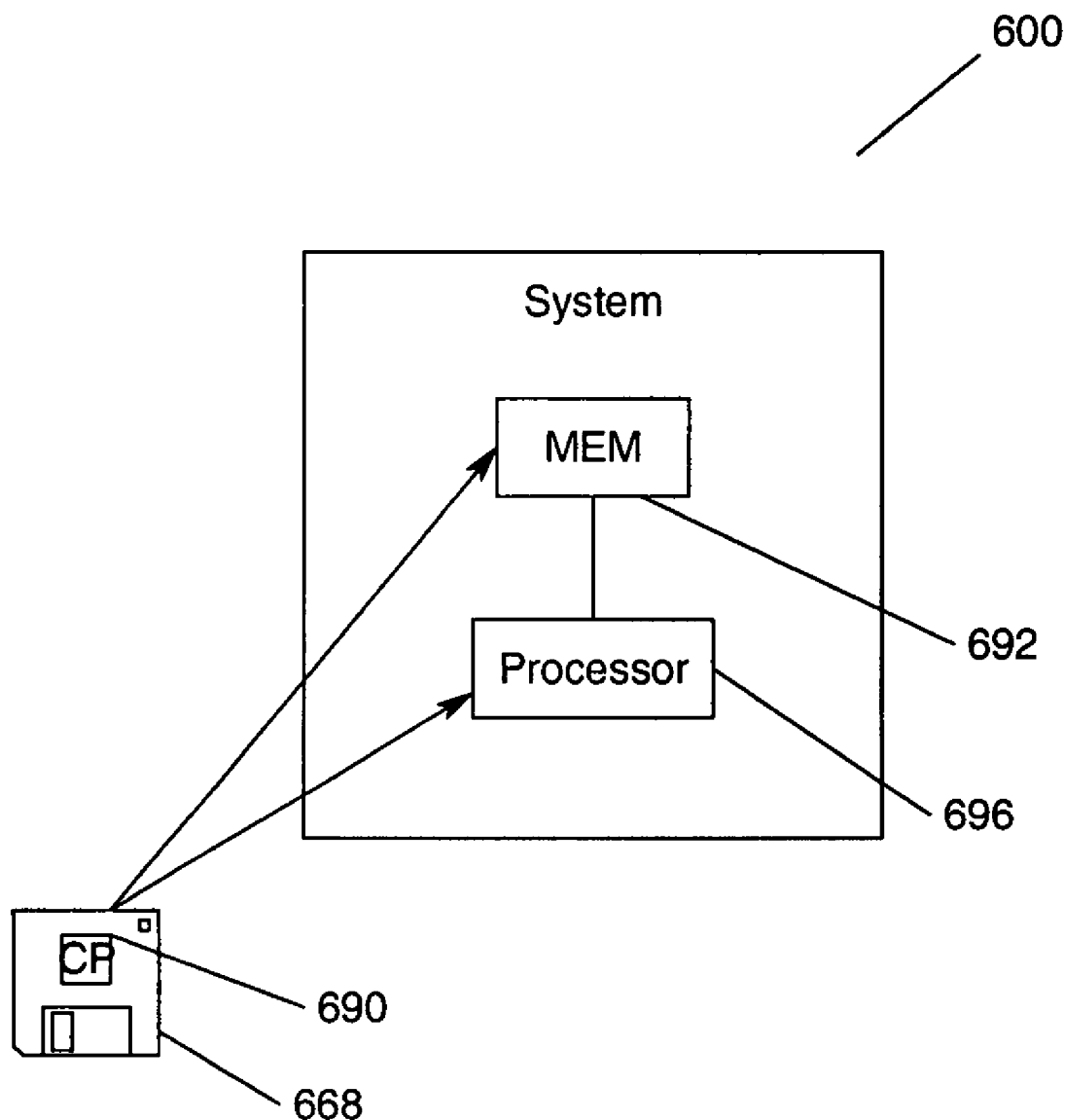
FIG. 6 illustrates a system and computer-readable medium wherein the process illustrated with reference to FIGS. 2-5 may be tangibly embodied in the computer-readable medium and performed by the system.

FIG. 6 illustrates a system 600 according to an embodiment of the present invention, wherein the process illustrated with reference to FIGS. 2-5 may be tangibly embodied in a computer-readable medium or carrier, e.g. one or more of the fixed and/or removable data storage devices 668 illustrated in FIG. 6, or other data storage or data communications devices. A computer program 690 expressing the processes embodied on the removable data storage devices 668 may be loaded into the memory 692 or processor 696, e.g., in a processor (not shown), to configure the system 600 of FIG. 6, for execution. The computer program 690 comprise instructions which, when read and executed by the system 600 of FIG. 6, causes the system 600 to perform the steps necessary to execute the steps or elements of the present invention.

The location information, attributes and functions of the logic blocks within a programmable logic device may be provided by configuration software or on-chip hardware. For example, software may be used to allow user input for determining the location and/or function during placement or to implement automated methods. The location and/or function could also be determined by a unique circuit at each location. Thus, the location and/or function of a circuit will determine it's environment and therefore it's performance. By providing the logic blocks with configuration data files that are based upon location information, it's characteristics may be modified to maximize performance and/or to provide additional functional constructs.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An integrated circuit (IC), comprising:
a plurality of multi-gigabit transceivers (MGTs);
a configuration memory for storing configuration data for configuring each MGT;
wherein each MGT has a respective set of one or more attributes that are configurable for compensating for respective performance variations of the MGT caused by location of the MGT on the IC; and
wherein for each attribute, the configuration memory has one or more corresponding memory cells, and a value from the configuration data configured into the one or more corresponding memory cells adjusts performance of a function performed by the MGT to compensate for the location of the MGT on the IC.

2. The integrated circuit of claim 1, wherein the respective set of one or more attributes includes an attribute for adjusting a delay for the MGT.

3. The integrated circuit of claim 1, wherein the set of one or more attributes includes an attribute for adjusting at least one attribute selected from a group consisting of setup times, hold times, clock width, clock period, propagation delay compensation and recovery time.

4. The integrated circuit of claim 1, wherein the integrated circuit includes a programmable logic device.

5. The integrated circuit of claim 1, wherein set of one or more attributes includes one or more attributes for improving performance.

6. The integrated circuit of claim 5, wherein the one or more attributes for improving performance comprises delay attributes representing a propagation delay difference between a first one and a second one of the respective MGT.

7. The integrated circuit of claim 1, wherein the set of one or more attributes includes an attribute for adjusting for packaging effects.

8. The integrated circuit of claim 7, wherein the set of one or more attributes includes an attribute for adjusting for parasitic effects.

9. A method for using location information to configure configurable blocks of a plurality of multi-gigabit transceivers (MGTs) within an integrated circuit (IC), comprising:

identifying the location information on the IC for a particular one of the MGTs;

storing, in a configuration memory, configuration data for configuring the particular one of the MGTs; and setting one or more attributes for the particular one of the MGTs in order to compensate for respective performance variations of the particular one of the MGTs based on the location information identified for the particular one of the MGTs; and wherein the setting includes, for each of the one or more attributes, storing one or more bits in one or more corresponding memory cells in the configuration memory, and a value from the configuration data stored in the one or more corresponding memory cells adjusts performance of a function performed by the MGT.

10. The method of claim 9, wherein the one or more attributes includes an attribute for adjusting a delay for the particular one of the MGTs.

11. The method of claim 9, wherein the one or more attributes includes an attribute for adjusting at least one attribute selected from a group consisting of setup times, hold times, clock width, clock period, propagation delay compensation and recovery time.

12. The method of claim 9, wherein the integrated circuit is a programmable logic device.

13. The method of claim 9, wherein the one or more attributes includes one or more attributes for improving performance.

14. The method of claim 13, wherein the one or more attributes for improving performance comprises delay attributes representing a propagation delay difference between the particular one of the MGTs and another one of the MGTs.

15. The method of claim 9, wherein the one or more attributes includes an attribute for adjusting for packaging effects.

16. The method of claim 9, wherein the one or more attributes includes an attribute for adjusting for parasitic effects.

* * * * *